United States Patent
Edmond et al.

(10) Patent No.: US 9,905,731 B2
(45) Date of Patent: Feb. 27, 2018

(54) HIGH OUTPUT GROUP III NITRIDE LIGHT EMITTING DIODES

(75) Inventors: John Adam Edmond, Cary, NC (US); Michael J. Bergmann, Chapel Hill, NC (US); David T. Emerson, Chapel Hill, NC (US); Kevin Ward Haberern, Cary, NC (US)

(73) Assignee: Cree, Inc., Durham, NC (US)

( * ) Notice: Subject to any disclaimer, the term of this patent is extended or adjusted under 35 U.S.C. 154(b) by 209 days.

(21) Appl. No.: 12/796,365

(22) Filed: Jun. 8, 2010

(65) Prior Publication Data

US 2010/0244052 A1    Sep. 30, 2010

Related U.S. Application Data

(60) Division of application No. 11/112,429, filed on Apr. 22, 2005, now Pat. No. 7,737,459, which is a continuation-in-part of application No. 11/082,470, filed on Mar. 17, 2005, and a continuation-in-part of application No. 11/037,965, filed on Jan. 18, 2005, and a continuation-in-part of application No. 10/951,042, filed on Sep. 22, 2004, now Pat. No. 7,259,402.

(51) Int. Cl.
*H01L 33/00* (2010.01)
*H01L 33/32* (2010.01)

(52) U.S. Cl.
CPC ............ *H01L 33/32* (2013.01); *H01L 33/007* (2013.01); *H01L 33/325* (2013.01)

(58) Field of Classification Search
CPC ....................................... H01L 33/32
USPC ............................................. 257/79, 94, 103
See application file for complete search history.

(56) References Cited

U.S. PATENT DOCUMENTS

| | | |
|---|---|---|
| 2,001,622 A | 5/1935 | McCaa |
| 4,675,875 A | 6/1987 | Takamlya et al. |
| 4,703,219 A | 10/1987 | Mesquida |
| 4,902,356 A | 2/1990 | Noguchi et al. |
| 4,912,532 A | 3/1990 | Cook et al. |
| 4,990,972 A | 2/1991 | Satoh et al. |
| 5,103,271 A | 4/1992 | Izumiya et al. |
| 5,162,878 A | 11/1992 | Sasagawa et al. |
| 5,376,580 A | 12/1994 | Kish et al. |

(Continued)

FOREIGN PATENT DOCUMENTS

| | | |
|---|---|---|
| EP | 0 810 674 | 12/1997 |
| EP | 1 263 058 A | 12/2002 |

(Continued)

OTHER PUBLICATIONS

Harle et al., "Advanced Technologies for High Efficiency GaInN LEDs for solid state lighting," Third International Conference on Solid State Lighting, Proceedings of SPIE, vol. 5187, Jan. 2004.*

(Continued)

*Primary Examiner* — Hsin-Yi Hsieh
(74) *Attorney, Agent, or Firm* — Myers Bigel, P.A.

(57) ABSTRACT

A light emitting diode is disclosed that includes a silicon carbide substrate and a light emitting structure formed from the Group III nitride material system on the substrate. The diode has an area greater than 100,000 square microns and has a radiant flux at 20 milliamps current of at least 29 milliwatts at its dominant wavelength between 390 and 540 nanometers.

10 Claims, 5 Drawing Sheets

(56) References Cited

U.S. PATENT DOCUMENTS

| | | | |
|---|---|---|---|
| 5,404,031 A | 4/1995 | Sasaki et al. | |
| 5,416,342 A | 5/1995 | Edmond et al. | |
| 5,429,954 A | 7/1995 | Gerner | |
| 5,502,316 A | 3/1996 | Kish et al. | |
| 5,696,389 A | 12/1997 | Ishikawa et al. | |
| 5,739,554 A | 4/1998 | Edmond et al. | |
| 5,779,924 A | 7/1998 | Krames et al. | |
| 5,792,698 A | 8/1998 | Nishitani | |
| 5,814,839 A | 9/1998 | Hosoba | |
| 5,838,706 A | 11/1998 | Edmond et al. | |
| 5,912,477 A | 6/1999 | Negley | |
| 5,962,875 A | 10/1999 | Motoki et al. | |
| 5,985,687 A | 11/1999 | Bowers et al. | |
| 6,057,562 A | 5/2000 | Lee et al. | |
| 6,071,795 A | 6/2000 | Cheung et al. | |
| 6,100,104 A | 8/2000 | Haerle et al. | |
| 6,120,600 A | 9/2000 | Edmond et al. | |
| 6,133,589 A | 10/2000 | Krames et al. | |
| 6,169,296 B1 | 1/2001 | Kamiyama et al. | |
| 6,187,606 B1 | 2/2001 | Edmond et al. | |
| 6,194,743 B1 | 2/2001 | Kondoh et al. | |
| 6,201,262 B1 | 3/2001 | Edmond et al. | |
| 6,242,761 B1 | 6/2001 | Fujimoto et al. | |
| 6,258,618 B1 | 7/2001 | Lester | |
| 6,258,699 B1 | 7/2001 | Chang et al. | |
| 6,287,947 B1 | 9/2001 | Ludowise et al. | |
| 6,303,405 B1 | 10/2001 | Yoshida et al. | |
| 6,335,263 B1 | 1/2002 | Cheung et al. | |
| 6,365,429 B1 | 4/2002 | Kneissl et al. | |
| 6,373,077 B1 | 4/2002 | Edmond et al. | |
| 6,403,985 B1 | 6/2002 | Fan et al. | |
| 6,410,940 B1 | 6/2002 | Jiang et al. | |
| 6,410,942 B1 | 6/2002 | Thibeault et al. | |
| 6,420,199 B1 | 7/2002 | Coman et al. | |
| 6,420,242 B1 | 7/2002 | Cheung et al. | |
| 6,420,735 B2 | 7/2002 | Kim | |
| 6,448,102 B1 | 9/2002 | Kneissl et al. | |
| 6,459,100 B1 | 10/2002 | Doverspike et al. | |
| 6,465,809 B1 | 10/2002 | Furukawa et al. | |
| 6,468,824 B2 | 10/2002 | Chen et al. | |
| 6,469,324 B1 | 10/2002 | Wang | |
| 6,486,499 B1 | 11/2002 | Krames et al. | |
| 6,492,661 B1 | 12/2002 | Chien et al. | |
| 6,514,782 B1 | 2/2003 | Wierer, Jr. et al. | |
| 6,521,914 B2 | 2/2003 | Krames et al. | |
| 6,534,798 B1 | 3/2003 | Sherer et al. | |
| 6,559,075 B1 | 5/2003 | Kelly et al. | |
| 6,562,648 B1 | 5/2003 | Wong et al. | |
| 6,576,930 B2 | 6/2003 | Reeh et al. | |
| 6,607,931 B2 | 8/2003 | Streubel | |
| 6,610,551 B1 | 8/2003 | Doverspike et al. | |
| 6,635,503 B2 | 10/2003 | Andrews et al. | |
| 6,649,437 B1 | 11/2003 | Yang et al. | |
| 6,657,236 B1 | 12/2003 | Thibeault et al. | |
| 6,664,560 B2 | 12/2003 | Emerson et al. | |
| 6,677,173 B2 | 1/2004 | Ota | |
| 6,716,654 B2 | 4/2004 | Hsu et al. | |
| 6,734,033 B2 | 5/2004 | Emerson et al. | |
| 6,740,604 B2 | 5/2004 | Kelly et al. | |
| 6,740,906 B2 | 5/2004 | Slater, Jr. et al. | |
| 6,747,298 B2 | 6/2004 | Slater, Jr. et al. | |
| 6,757,314 B2 | 6/2004 | Kneissl et al. | |
| 6,786,390 B2 | 9/2004 | Yang et al. | |
| 6,791,119 B2 | 9/2004 | Slater, Jr. et al. | |
| 6,794,690 B2 | 9/2004 | Uemura | |
| 6,800,500 B2 | 10/2004 | Coman et al. | |
| 6,800,876 B2 | 10/2004 | Edmond et al. | |
| 6,806,112 B1 | 10/2004 | Horng et al. | |
| 6,809,341 B2 | 10/2004 | Hsu et al. | |
| 6,812,502 B1 | 11/2004 | Chien et al. | |
| 6,815,312 B2 | 11/2004 | Furukawa et al. | |
| 6,821,804 B2 | 11/2004 | Thibeault et al. | |
| 6,825,501 B2 | 11/2004 | Edmond et al. | |
| 6,828,596 B2 | 12/2004 | Steigerwald et al. | |
| 6,831,302 B2 | 12/2004 | Erchak et al. | |
| 6,844,571 B2 | 1/2005 | Krames et al. | |
| 6,846,686 B2 | 1/2005 | Saeki et al. | |
| 6,849,878 B2 | 2/2005 | Bader et al. | |
| 6,900,472 B2 | 5/2005 | Kondoh et al. | |
| 6,992,334 B1 | 1/2006 | Wierer, Jr. et al. | |
| 7,064,353 B2 * | 6/2006 | Bhat | 257/79 |
| 7,135,709 B1 | 11/2006 | Wirth et al. | |
| 7,148,520 B2 | 12/2006 | Yoo | |
| 7,166,870 B2 | 1/2007 | Erchak et al. | |
| 7,211,833 B2 | 5/2007 | Slater, Jr. et al. | |
| 7,250,635 B2 | 7/2007 | Lee et al. | |
| 7,294,866 B2 | 11/2007 | Liu | |
| 7,442,966 B2 | 10/2008 | Bader et al. | |
| 7,501,023 B2 | 3/2009 | Dmitriev et al. | |
| 7,514,720 B2 | 4/2009 | Kim et al. | |
| 2002/0022290 A1 | 2/2002 | Kong et al. | |
| 2002/0068373 A1 | 6/2002 | Lo et al. | |
| 2002/0121642 A1 | 9/2002 | Doverspike et al. | |
| 2002/0123164 A1 * | 9/2002 | Slater et al. | 438/39 |
| 2002/0197764 A1 | 12/2002 | Uemura et al. | |
| 2003/0015721 A1 | 1/2003 | Slater et al. | |
| 2003/0045015 A1 | 3/2003 | Slater, Jr. et al. | |
| 2003/0132701 A1 | 7/2003 | Sato et al. | |
| 2003/0173602 A1 | 9/2003 | Hsu et al. | |
| 2003/0197170 A1 | 10/2003 | Bader et al. | |
| 2004/0004226 A1 | 1/2004 | Eisert et al. | |
| 2004/0012027 A1 | 1/2004 | Keller et al. | |
| 2004/0033638 A1 | 2/2004 | Bader et al. | |
| 2004/0051118 A1 | 3/2004 | Bruhns et al. | |
| 2004/0072382 A1 | 4/2004 | Kelly et al. | |
| 2004/0124429 A1 | 7/2004 | Stokes et al. | |
| 2004/0135158 A1 | 7/2004 | Hon | |
| 2004/0232812 A1 | 11/2004 | Beeson et al. | |
| 2004/0256632 A1 | 12/2004 | Stein et al. | |
| 2005/0006669 A1 | 1/2005 | Mishra et al. | |
| 2005/0018725 A1 | 1/2005 | Nurmikko | |
| 2005/0269588 A1 * | 12/2005 | Kim et al. | 257/99 |
| 2006/0054909 A1 | 3/2006 | Shin et al. | |
| 2009/0166659 A1 | 7/2009 | Edmond et al. | |

FOREIGN PATENT DOCUMENTS

| | | |
|---|---|---|
| EP | 1 335 434 A1 | 8/2003 |
| EP | 1 416 543 A1 | 5/2004 |
| JP | 61059886 | 3/1986 |
| JP | 11238913 | 8/1999 |
| JP | 2003-249694 A | 9/2003 |
| JP | 2004-047760 A | 2/2004 |
| JP | 2004-260178 A | 9/2004 |
| WO | WO 0141225 A2 | 6/2001 |

OTHER PUBLICATIONS

Dmitriev et al. "Compound Semiconductor Materials, Method and Apparatus to Produce the Same", U.S. Appl. No. 60/449,085, filed Feb. 21, 2003.

Fujioka et al., "Improvement in Output Power of 280-nm Deep Ultraviolet Light Emitting Diode by Using AlGaN Multi Quantum Wells", *Applied Physics Express*, vol. 3, Mar. 26, 2010, pp. 041001-1-041001-3.

Haerle et al., "High brightness LEDs for general lighting applications Using the new ThinGaN™—Technology", *phys. stat. sol. (a)*; 201(12):2736-2739; Sep. 2004.

Correspondence regarding Office Action in Japanese Patent Application No. 2007-533557, dated Aug. 19, 2011, 4 pages.

Kim et al., "Performance of High-Power AlInGaN Light Emitting Diodes", *phys. stat. sol. (a)*, 188(1):15-21, 2001.

Lumileds, "Technical Data DS39—P5 Series InGaN LED Chips", 2002, 5 pp.

Pernot et al., "Improved Efficiency of 255-280 nm AlGaN-Based Light-Emitting Diodes", *Applied Physics Express*, Jun. 11, 2010, pp. 061004-1-061004-3.

Schubert et al., "Electron-beam excitation", *Nature Photonics*, vol. 4, Nov. 2010, pp. 735-736.

Shchekin et al., "High performance thin-film flip-chip InGaN—GaN light-emitting diodes", *Applied Physics Letters*, 89(7):071109-071109-3, Aug. 2006.

(56) References Cited

OTHER PUBLICATIONS

Tadatomo et al., "High output power near-ultraviolet and violet light-emitting diodes fabricated on patterned sapphire substrates using metalorganic vapor phase epitaxy", *Proc. of SPIE*, 5187:243-249, Jan. 2004.
Thibeault et al. "Enhanced Light Extraction Through Integrated Microlens Arrays and Dispersive Elements", U.S. Appl. No. 60/168,817, filed Dec. 3, 1999.
Japanese Office Action Corresponding to Japanese Patent Application No. 2007-533557; Dispatch Date: Mar. 9, 2012; English Translation, 2 pages.
Japanese correspondence regarding JP office action dated Jul. 7, 2010, Ref. JP Patent Application No. 2007-533557, 4 pages.
Communication Pursuant to Article 94(3) EPC, EPO Application No. 05808877.4, dated Sep. 15, 2016.
Harle et al., Advanced Technologies for High Efficiency GaInN LEDs for Solid State Lighting, Third Intl. Conference on Solid State Lighting, Proc. of SPIE, vol. 5187, 2004.
Koike et al., Development of High Efficiency GaN-based Multiquantum—Well Light Emitting Diodes and their Applications, IEEE, vol. 8 No. 2, Mar.-Apr. 2002.
Kuo et al., Nitride-based Near-Ultraviolet LEDs with an ITO Transparent Contact, Materials Science and Engineering, vol. B106, pp. 69-72, 2004.
Gardner et al., High-Flux and High Efficiency Nitride-Based Light Emitting Diodes, IEEE, pp. 641-642, 2002.
Craford, M. George, Visible LEDs: The Trend Toward High Power Emitters and Remaining Challenges for Solid State Lighting, Solid State Lighting II, Proc. of SPIE, vol. 4776, 2002.
Niki et al., White LEDs for Solid State Lighting, Third International Conference on Solid State Lighting, Proc. of SPIE, vol. 5187, 2004.
Tadamoto et al., High Output Power Near-Ultraviolet and Violet Light-Emitting Diodes Fabricated on Patterned Sapphire Substrates Using Metalorganic Vapor Phase Epitaxy, Third Intl. Conference on Solid State Lighting, Proc. of SPIE, vol. 5187, 2004.
Mukai et al., Recent Progress of Nitride-Based Light Emitting Devices, Phys. Stat. Sol. vol. 200, No. 1, pp. 52-57, 2003.
Mukai et al., GaN-based Light Emitting Diodes Suitable for While Light, Light Emitting Diodes: Research, Manufacturing, and Applications VII, Proc. of SPIE, vol. 4996, 2003.
Morita et al., Over 200mW on 365 nm Ultraviolet Light Emitting Diode of GaN-free Structure, Phys. Stat. Sol., vol. 200, No. 1, pp. 114-117, 2003.
United Epitaxy Company, Ltd., Specifications Confirmation Letter, 4713DC AlInGaN Blue LED Chip, 2003.
Labsphere, The Radiometry of Light Emitting Diodes—Technical Guide.
Epitech Technology Corporation, Traffic Green LED Chip, Dec. 2003.
Seoul Semiconductor Co. Ltd., AlInGaN LED DICE, 2003.
Epitech Technology Corporation, Near Blue LED Chip, Dec. 2003.
Unity Opto Technology Co., Ltd., AlGaAs/GaAs High Power T-1 ¾ Package Infrared Emitting Diode, Nov. 17, 2000.
Nichia Corporation, White LED Analysis, Mar. 17, 2004.
Instrument Systems, LED Station, MAS 40 Turn-key System for LED Testing.
Bulman, G.E. et al; "Nitride Lasers on SiC Substrates," Lasers and Electro-Optics Annual Meeting, ISBN 0-7803-4947-4, IEEE, Dec. 1, 1998, vol. 2, pp. 348-349.
Windisch R, et al; "40% Efficient Thin-Film Surface-Textured Light Emitting Dios by Optimization of Natural Lithography," IEEE Transactions on Electron Devices, ISSN: 0018-9383, vol. 47 No. 7, Jul. 2000, pp. 1492-1498.
Nakamura S, et al; "Superbright Green Ingan Single-Quantum-Well Structure Light-Emitting Diodes," Japanese Journal of Applied Physics, ISSN; 0021-4922, vol. 34, No. 10B, Part 2, Oct. 15, 1995, pp. L1332-L1335.
Office Action from related Korean Application No. 10-2007-7006475, dated Dec. 23, 2009.
Office Action from related Korean Application No. 10-2008-7027784, dated Dec. 15, 2009.
Edmond et al., Corresponding author: Cree, Inc., "High efficiency GaN-based LEDs and lasers on SiC", Journal of Crystal Growth 272 (2004) pp. 242-250.

\* cited by examiner

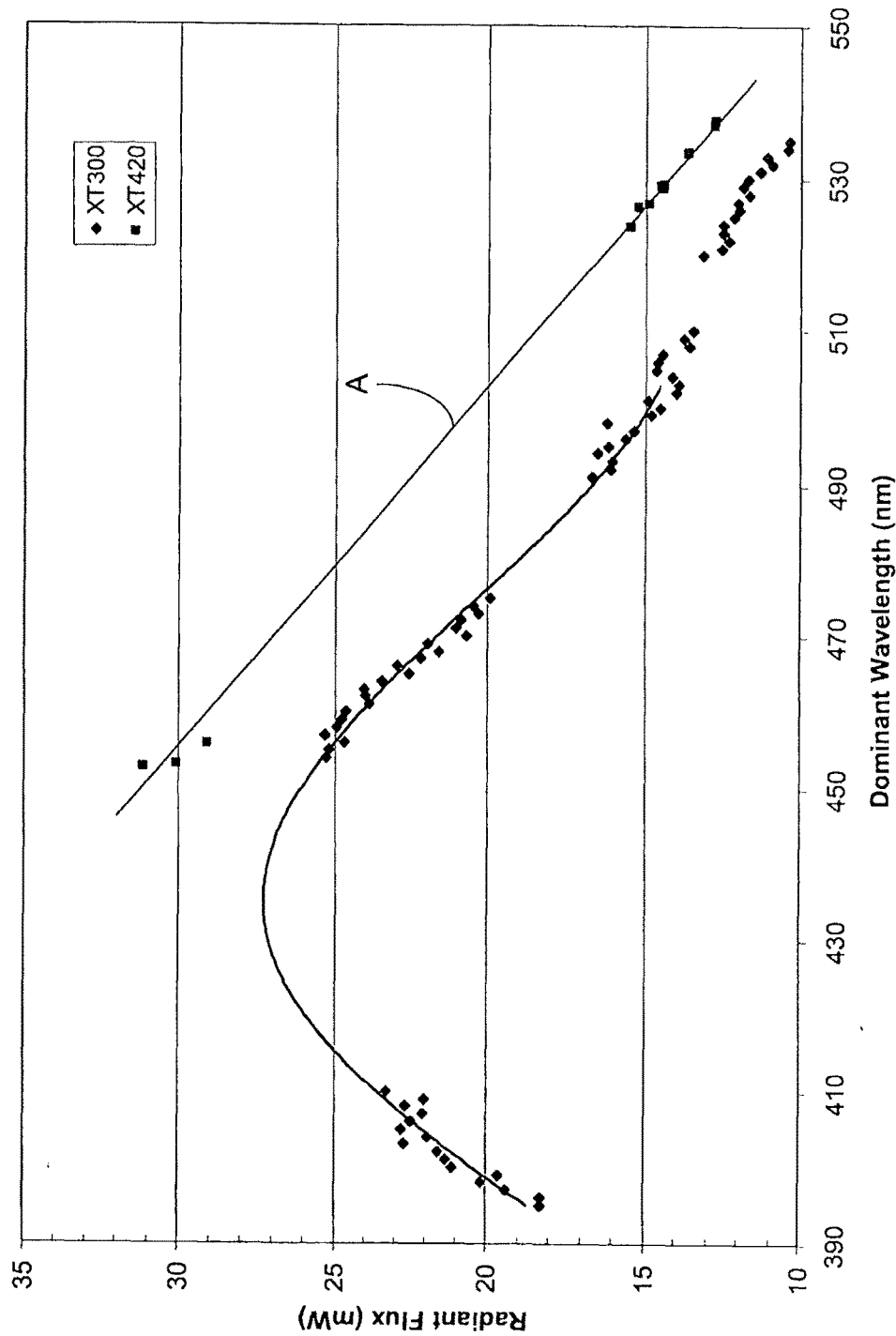
Fig. 2  Performance of XT LEDs @ 20 mA

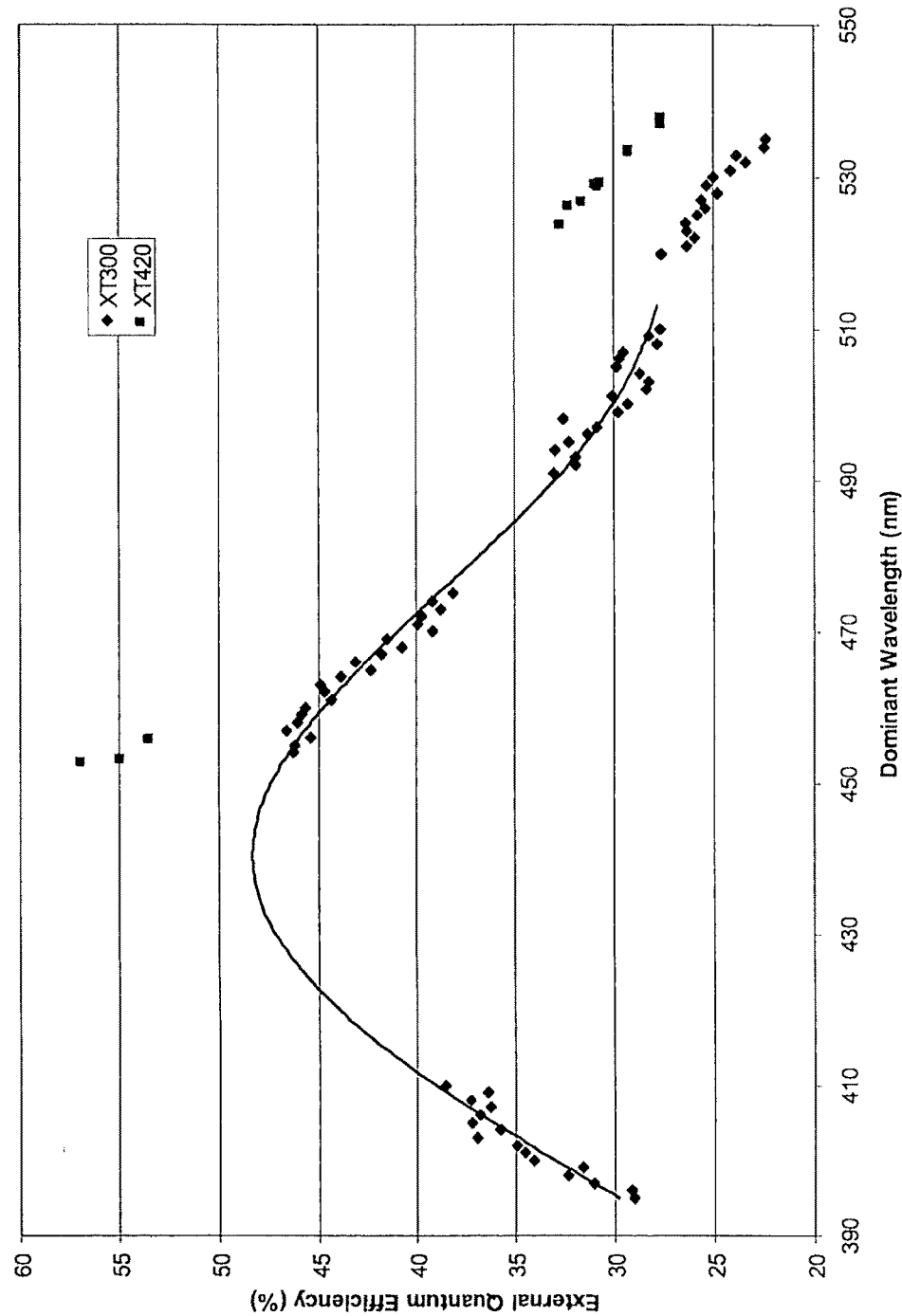

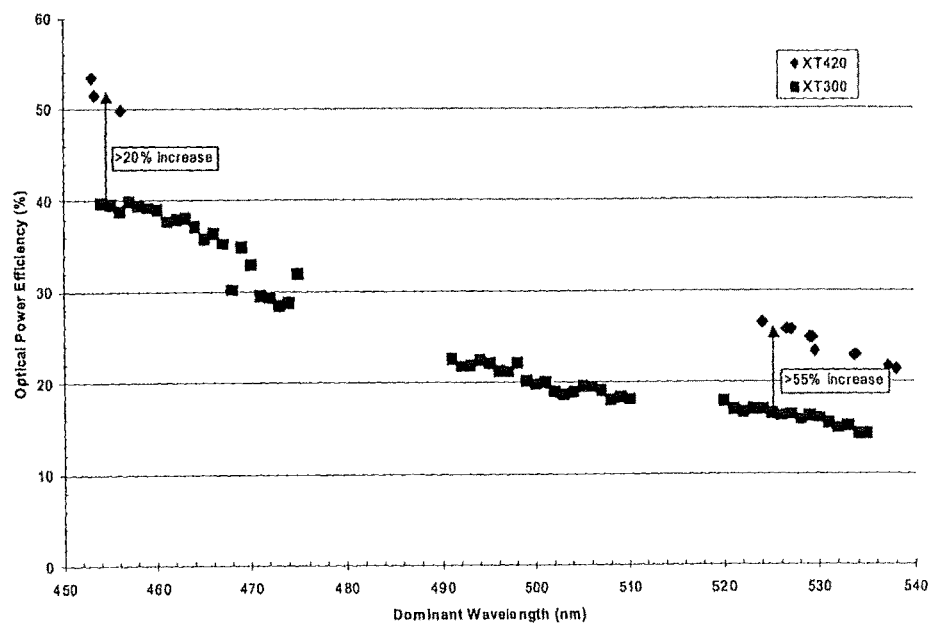
Fig. 4  Power Efficiency for 300 and 420 um XTs
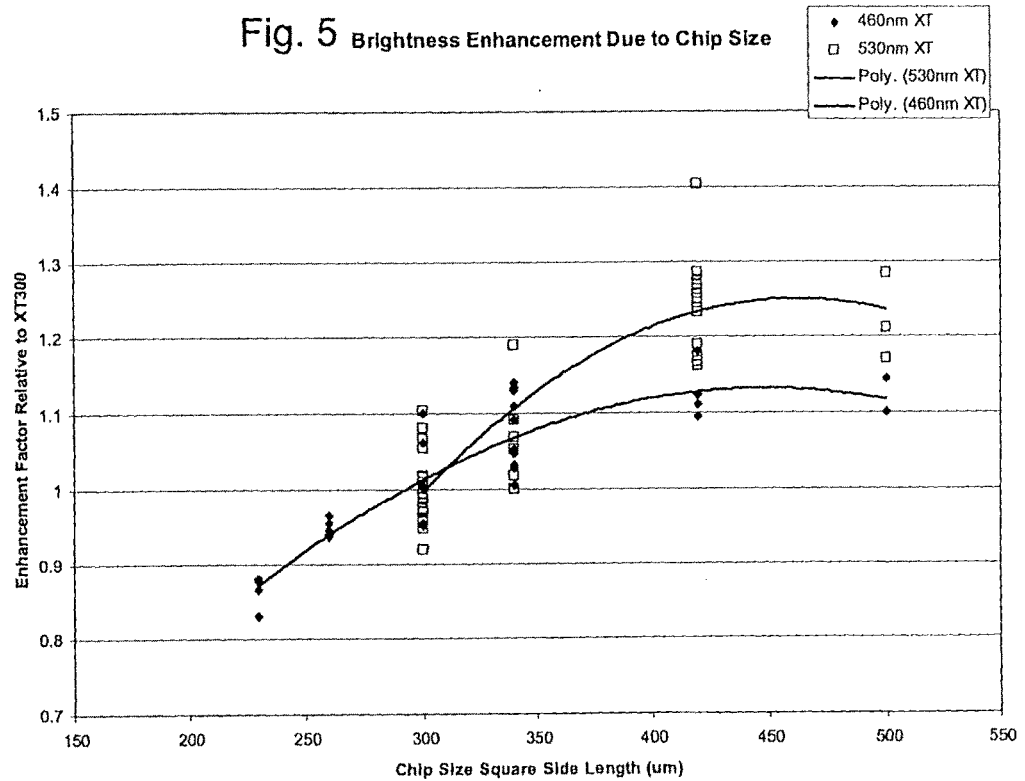
Fig. 5  Brightness Enhancement Due to Chip Size

HIGH OUTPUT GROUP III NITRIDE LIGHT EMITTING DIODES

RELATED APPLICATIONS

This application is a divisional of Ser. No. 11/112,429 filed Apr. 22, 2005 now U.S. Pat. No. 7,737,459 which is a continuation in part of Ser. No. 11/082,470 filed Mar. 17, 2005 for "High Efficiency Group III Nitride LED with Lenticular Surface;" and of Ser. No. 11/037,965 filed Jan. 18, 2005 for "High Output Small Area Group III nitride LEDs;" and of Ser. No. 10/951,042 filed Sep. 22, 2004 now U.S. Pat. No. 7,259,402 for "High Efficiency Group III Nitride Silicon Carbide Light Emitting Diode." The contents of each of these applications are incorporated entirely herein by reference.

BACKGROUND

The present invention relates to light emitting diodes (LEDs) and in particular relates to LEDs formed with active portions of Group III nitrides on silicon carbide substrates.

As set forth in Ser. No. 11/037,965 cited above ("the '965 application"), significant improvements have recently been demonstrated in the output of light emitting diodes based on the Group III nitride material system using conductive silicon carbide substrates. In particular, the '965 application discloses light emitting diodes that have high brightness on a unit area basis.

A light emitting diode (LED) is a p-n junction semiconductor diode that emits photons when forward biased. Thus, light emitting diodes produce light based upon the movement of electrons in a semiconductor material. Therefore, LEDs do not require (although they can be used in conjunction with) vapors or phosphors. They share the desirable characteristics of most semiconductor-based devices, including high efficiency (their emissions include little or no heat), high reliability and long life. For example, typical LEDs have a mean time between failures of between about 100,000 and 1,000,000 hours meaning that a conservative half lifetime for an LED is on the order of 50,000 hours.

In particular, an LED's emitted light has a frequency (which in turn relates directly to wavelength and color in accordance with well-understood principles of physics) based upon the energy difference between permitted energy levels in the material, a characteristic referred to as the bandgap. The bandgap is a fundamentally property of the semiconductor material and its doping. Thus, LEDs formed in silicon (Si, bandgap of 1.12 electron volts (eV)) will have energy transitions in the infrared (but not the visible) portions of the spectrum. Silicon-based diodes are thus used for items such as low-cost sensors in which visibility to the human eye is either unimportant or specifically undesired. LEDs formed in gallium arsenide (bandgap 1.42 eV), or most commonly in silicon-doped aluminum gallium arsenide (AlGaAs) will emit in the visible portion of the spectrum, but at lower frequencies that produce infrared radiation and red and yellow light.

In turn, because green, blue, and ultraviolet (UV) photons represent higher frequency colors ($E=h\upsilon$) within (and beyond) the visible spectrum, they can only be produced by LEDs with bandgaps of at least about 2.2 eV. Such materials include diamond (5.47 eV), silicon carbide (2.99 eV) and Group III nitrides such as GaN (3.4 eV). In addition to producing green, blue or ultraviolet light per se, wide bandgap LEDs can be combined with red and green LEDs to produce white light, or with phosphors that produce white light when excited by blue or UV light, or both.

For several reasons, the Group III nitride compositions (i.e., Group III of the periodic table), particularly GaN, AlGaN, InGaN and AlInGaN are particularly useful for blue-emitting LEDs. As one advantage, they are "direct" emitters, meaning that when an electron transition occurs across the bandgap, much of the energy is emitted as light. By comparison, "indirect" emitters (such as silicon carbide) emit their energy partially as light (a photon) and predominantly as vibrational energy (a phonon). Thus Group III nitrides offer efficiency advantages over indirect transition materials. The Group III nitrides will also be referred to herein as the Group III nitride material system.

As another advantage, the bandgap of ternary and quaternary Group III materials (e.g., AlGaN, InGaN, AlInGaN) depends upon the atomic fraction of the included Group III elements. Thus the wavelength (color) of the emission can be tailored (within limits) by controlling the atomic fraction of each Group III element in a ternary or quaternary nitride.

Wide bandgap semiconductors have been, however, historically more difficult to produce and work with than gallium-arsenide or gallium phosphide (GaP). As a result, blue and UV-emitting LEDs have lagged behind GaP-based LED's in their commercial appearance. For example, silicon carbide is physically very hard, has no melt phase, and requires high temperatures (on the order of about 1500-2000° C.) for epitaxial or sublimation growth. The Group III nitrides have relatively large nitrogen vapor pressures at their melting temperatures and thus are likewise difficult or impossible to grow from a melt. Additionally, difficulties in obtaining p-type gallium nitride (and other Group III nitrides) remained a barrier to diode production for a number of years. Accordingly, the commercial availability of blue and white-emitting LEDs is more recent than the corresponding availability of GaP-based and GaAs-based LEDs.

For comparison and other relevant purposes, lighting is typically quantified as to its output. One typical unit of measure is the lumen, defined as a unit of luminous flux equal to the light emitted in a unit solid angle by a uniform point source of one candela (cd) intensity. In turn, the candela is the base unit of luminous intensity in the International System of Units that is equal to the luminous intensity in a given direction of a source which emits monochromatic radiation of frequency $540 \times 10^{12}$ hertz and has a radiant intensity in that direction of $\frac{1}{683}$ watt per unit solid angle.

Using lumens as the unit of measurement, an intensity of 1200-1800 lumens is typical of incandescent bulbs and 1000-6000 lumens (depending upon circumstances) is typical in natural daylight. Light emitting diodes, however, are much less intense, for example on the order of about 10-100 lumens. One reason is their small size. Thus, applications for single (or small groups of) LEDs have historically gravitated towards indication (e.g. the register of a hand-held calculator) rather than illumination (a reading lamp). Although the availability of blue LEDs and corresponding white-emitting devices have moved such LEDs into wider commercial availability, for illumination purposes, several (or more) LEDs are typically grouped together to provide the desired output.

Because of their typical size and structure, the output of LEDs is often measured in units other than lumens. Additionally, an LED's output also depends upon the applied current, which in turn depends upon the potential difference applied across the diode. Thus, the output of an LED is often referred to as its radiant flux ($R_f$) and is expressed in milliwatts (mW) at a standard 20 milliamp (mA) drive current.

Blue LEDs are becoming more frequently included in consumer electronic devices, particularly small displays. Common examples include items such as computer screens, personal digital assistants ("PDAs") and cellular phones. In turn, these small devices drive demand for LEDs with reduced size ("footprint"). Such LEDs, however, must still operate at low forward voltages ($V_f$) and high light output. To date, however, reducing the size of the blue-emitting Group III nitride devices has tended to increase their forward voltage and reduce their radiant flux.

As noted above, the LEDs disclosed in the '965 application offers significant advantages in increased brightness (using the standard parameters noted above) and reduced forward voltage even at small size.

Although small, relatively thin LEDs are advantageous for smaller devices (such as cellular phone displays); the incorporation of LEDs into larger devices presents different challenges. For example, using greater numbers of small diodes in larger displays can reduce energy conversion, increase power consumption and require the manufacturer to purchase, assemble and maintain a greater number of components. Larger numbers of smaller components can also increase weight, size, volume and the number of required electrical connections. Statistically, larger numbers of smaller devices will include a larger absolute number of defects and may require the manufacturer to maintain larger inventories in order to maintain or increase a given reliability.

As one example, electronic visible displays such as oscilloscopes, televisions, and computer monitors, have historically been based upon cathode ray tubes ("CRTs"). In recent years, however, the advances in various technologies commonly grouped as "flat panel" displays have rapidly displaced cathode ray tubes for many purposes and in particular for consumer uses such as televisions and monitors for personal computers.

Additionally, these and other technologies have in turn driven the growth of much larger displays for consumer and other personal use. Examples include plasma-based and liquid crystal ("LCD") television screens that are quite large compared to their technological ancestors; i.e., 46 inch flat-panel televisions in place of 21 inch CRT-based televisions.

In particular, liquid crystal displays operate by changing the orientation of liquid crystals, and thus their appearance, using appropriate electrical controls. Liquid crystals do not emit light, however, and thus LCD displays such as televisions must be back lit by some additional source. The availability of "RGB" (red, green, and blue) or white light emitting diodes in large quantity at competitive cost offers such an appropriate back lighting source.

A large display, however, requires a large number of light emitting diodes. In turn, the individual diodes must be physically supported and functionally incorporated into electronic circuits. Furthermore, although light emitting diodes are highly efficient in comparison to incandescent lighting, they still generate a finite amount of energy as heat. Thus, incorporating hundreds or thousands of light emitting diodes into larger applications, particularly those used indoors, correspondingly generates noticeable, or even troublesome amounts of heat and other technological challenges.

Because both complexity and heat are typical problems that must be addressed in designing and using electronic equipment (including large flat-panel displays) that incorporates LEDs, a need exists, and corresponding benefits are desired, for further increasing the efficiency and output of light emitting diodes. This need includes the call for light emitting diodes that produce white light from blue emitting diodes either by incorporating phosphors or through their combination with red and green LEDs.

Accordingly, a need exists for continual improvement in the output of small-size LEDs formed in the Group III nitride silicon carbide material system.

SUMMARY

In one aspect, the invention is a light emitting diode comprising a silicon carbide single crystal substrate, a light emitting structure formed from the Group III nitride material system on the single crystal substrate, the diode having an area greater than 100,000 square microns, and in many examples at least one side that is at least 400 microns in length, and the diode having a radiant flux at 20 milliamps current of at least 29 milliwatts at its dominant wavelength between 390 and 540 nanometers.

In another aspect the invention is a light emitting diode comprising quantum efficiency a silicon carbide single crystal substrate, a light emitting structure formed from the Group III nitride material system on the single crystal substrate, the diode having an area of at least 100,000 square microns, and in many examples at least one side that is at least 400 microns in length and, and the diode having an external quantum efficiency greater than 50 percent at 20 milliamps current at its dominant wavelength between 390 and 540 nanometers.

In yet another aspect the invention is a light emitting diode comprising a silicon carbide single crystal substrate, a light emitting structure formed from the Group III nitride material system on the single crystal substrate, the diode having an area of at least 100,000 square microns, and in many examples at least one side that is at least 400 microns in length, and the diode having an optical power efficiency of at least 50 percent at a dominant wavelength between 450 and 460 nanometers.

The foregoing and other advantages of the invention and the manner in which the same are accomplished will become clearer based on the followed detailed description taken in conjunction with the accompanying drawings.

BRIEF DESCRIPTION OF THE DRAWINGS

FIG. 2 is a plot of radiant flux as against dominant wavelength in nanometers that includes LEDs according to the present invention.

FIG. 3 is a plot of external quantum efficiency as against dominant wavelength that includes LEDs according to the present invention.

FIG. 4 is a plot of optical power efficiency versus dominant wavelength for LEDs according to the present invention.

FIG. 5 is a plot of light enhancement as against chip size for diodes according to the present invention.

DETAILED DESCRIPTION

Figure 1:
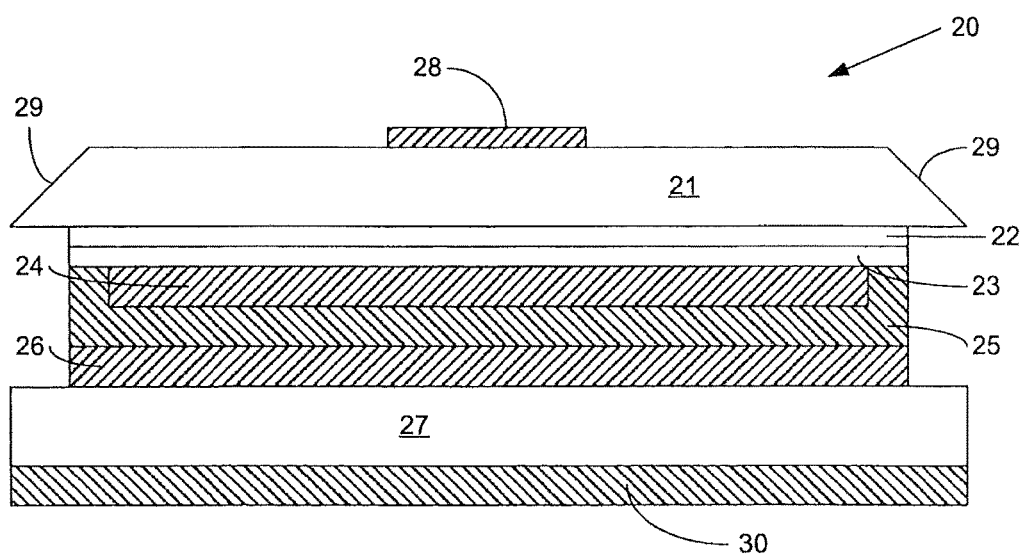
FIG. 1 is a cross sectional schematic view of one embodiment of a diode according to the present invention.

The invention is a light emitting diode formed in the Group III nitride material system, often on silicon carbide (SiC) substrates. In particular, and in comparison to recent generations of light emitting diodes, the diodes according to the present invention have an area greater than 100,000 square microns and, as set forth in the following discussion and in the drawings, properties such as a radiant flux at 20 milliamps current of at least 29 milliwatts at the diode's dominant wavelength between 390 and 540 nanometers.

In particular, diodes of this size will typically have at least one side that is at least 400 microns in length, with exemplary diodes forming a square with each side being 420 microns.

In the blue frequencies, the diodes have a radiant flux at 20 milliamps current of at least 29 milliwatts at the dominant wavelength between 450 and 460 nanometers.

In the green frequencies, the diode has a radiant flux of at least 12 milliwatts at its dominant wavelength between 530 and 540 nanometers.

The performance of the diodes is set forth in the accompanying drawings, and these drawings, taken with this detailed description, give a full clear, concise, and exact description of the diodes to those of ordinary skill practicing in this art.

As set forth in the Background, a number of structural features of the invention are set forth in the commonly assigned, copending, and incorporated applications. In some instances, the improvements described herein are most clearly expressed in comparison to the diodes described in previously incorporated application Ser. No. 11/037,965. The diodes described in the '965 application may be referred to herein as "'965 diodes" or in some similar manner. The same type of description may be applied to refer to other material in the copending applications, with the meaning also being clear in context.

FIG. 1 is a cross sectional view of a light emitting diode broadly designated at 20 having the performance characteristics of the present invention. The diode 20 includes a transparent silicon carbide substrate 21 which is preferably a single crystal and has a polytype selected from the 3C, 4H, 6H, and 15R polytypes of silicon carbide with 4H often being preferred in the context of the present invention. Because FIG. 1 illustrates the diode 20 in the "flip chip" orientation (i.e., mounted for use with the active layers below the substrate), the substrate 21 appears at the top of the diode 20 rather than the bottom. In this orientation, the SiC substrate becomes the primary emitting surface of the LED. It will be understood of course, that light emitting diodes can be placed in a number of different positions and orientations in end use. Thus with respect to the elements of the diode 20, the terms, "top," and "bottom," are relative and generally indicate the orientation of the device in a structural sense. Additionally, references to layers being "on" one another can include layers that are above, but not in direct contact with, other layers. The meaning will be clear in context. The use of these terms is common and well understood in this art and will also be clear from the context herein.

The diode includes at least one, and preferably several, layers that form the light emitting ("active") portions. These layers are selected from the Group III nitride material system. Two layers are shown in FIG. 1, an n-type layer 22 and a p-type layer 23. These opposite conductivity type layers provide the opportunity for current to flow through the diode and the resulting combination of electrons and holes that generate the emitted photons. Although only two Group III nitride layers are illustrated in FIG. 1, it will be understood that in other contexts, additional layers can be used including superlattice structures and multiple quantum wells. In particular, buffer layers are often included for providing a crystal and electronic transition from the SiC substrate to the Group III light emitting layers.

Such structures are well-understood in this art and can be practiced in the context of the present invention without undue experimentation.

The embodiment illustrated in FIG. 1 also includes a mirror layer 24 which is typically formed of silver (Ag) or a silver-platinum (Ag/Pt) alloy. The silver-based layer also provides electrical contact to the active layers 22, 23. A barrier layer 25 typically formed of a titanium tungsten (TiW) alloy, or platinum, or both, or of titanium tungsten nitride (TiWN), encloses the silver-based layer 24 in order to prevent undesired migration and reaction of silver with other portions of the device.

A solder layer 26 is attached to the barrier layer 25 typically, but not exclusively, based upon the method of making the diode. These and other structural features are set forth in the previously-incorporated '042 and '965 applications. A metal or conductive semiconductor layer 27 forms a physical support and a backside ohmic contact 30 completes the structure and, with the top ohmic contact 28, provides the full current path for injecting current through the diode 20.

In an alternate embodiment, the metal or semiconductor support layer 27 can be omitted, with or without the solder layer 26. In such embodiments, the backside ohmic contact 30 is positioned against the mirror and barrier metals 24, 25.

As illustrated in FIG. 1, the active layers are typically selected from the Group III nitride material system, with gallium nitride (GaN), indium gallium nitride (InGaN), aluminum gallium nitride (AlGaN), and aluminum indium gallium nitride (AlInGaN) being appropriate selections. As known to those familiar with this art, the Group III nitride material system offers the opportunity to change the dominant wavelength by changing the atomic fraction of the Group III element in the ternary and quaternary combinations. As well understood in this art, these formulas can be more exactly expressed as $Al_xIn_yGa_{1-x-y}N$ in which x and y can range from 0 to 1, and inclusive of either, with the qualification that x+y must always equal 1 or less.

Diodes according to the invention have an area greater than 100,000 square microns. Examples include, but are not limited to diodes that have at least one side that is at least 400 microns in length and that are square or rectangular in their geometry.

Diodes according to the invention can also incorporate the lenticular surfaces described in copending and incorporated application Ser. No. 11/082,470.

FIG. 2 is a plot of radiant flux in milliwatts (mW) as against dominant wavelength in nanometers (nm) for diodes according to the present invention and shown in comparison to diodes as described in the '965 application. Data points for the '965 diodes are plotted using the diamond shapes (lower curve), while the larger diodes according to the present invention are plotted using the squares (upper curve).

In all of FIGS. 2-6, the respective diodes are operated and evaluated at 20 milliamps (mA) current. In this regard, because the diodes are larger, the current density at any given current (including the standard specification current of 20 milliamps) is lower. As known to those familiar with the art, the lower current density typically produces a higher light output from the light emitting layer. Additionally, forward voltage decreases as chip area increases at any given current. For example, diodes according to the present invention demonstrate forward voltage as low as 2.9 volts versus 3.1 volts for diodes according to the '965 application. Although a 0.2 V decrease may seem small, the cumulative gain in wall plug efficiency is significant when hundreds or even thousands of diodes are incorporated into large items such as liquid crystal display screens. Thus, diodes according to the present invention offer the capability for brighter displays using power levels equivalent to current diodes or, as may be desired or necessary, brightness equivalent to current diodes at lower power and higher efficiency.

In this regard, FIG. 2 shows three diodes according to the present invention that emit at a wavelength of approximately 450 nanometers (i.e., blue at a dominant wavelength of 453-456 nm) and produce a radiant flux of between about 29 and 31 milliwatts. This compares (vertical dotted line) to an output of about 25-26 milliwatts for the somewhat smaller diodes described in the '965 application. In particular, when based on the smaller chip sizes, the invention represents an increase of about 14 percent in radiant flux.

Radiant flux (e.g. FIG. 2) is measured by placing an encapsulated lamp of the T1¾ type in an integrating sphere attached to a spectrometer, with the Labsphere Omni LTS spectrometer for visible LEDs being an exemplary measurement device. Radiant flux is measured in units of power (Watts). The other comparative factors—e.g. external quantum efficiency, power efficiency, and brightness enhancement—are all based on these radiant flux measurements.

In the green wavelengths (approaching 540 nm in FIG. 2), the improvement is about 2-3 milliwatts at each data point representing an increase of about 25 percent as compared to the diodes from the '965 application. As illustrated in FIG. 2, the diodes have a radiant flux of at least 12 mW at dominant wavelengths between 520 and 540 nm; 13 mW between 524 and 535 nm; and 15 mW between 524 and 527 nm.

FIG. 3 offers similar data expressed as external quantum efficiency. FIG. 3 plots data points from the '965 diodes as circles and from the improved diodes according to the present invention as squares. Once again at wavelengths of about 450 nanometers (blue), the external quantum efficiency increases from about 47 percent to at least about 54 percent. Expressed as a comparative increase, this represents an increase of between about 15 percent, consistent with the increase in radiant flux shown in FIG. 2.

FIG. 3 further illustrates that in the green wavelengths (approaching 540 nm), the absolute increase is on the order of five or six percent which, when based upon the '965 diodes represents a comparative increase of about 25 percent.

As background and further explanation with respect to FIG. 3, green LEDs saturate more quickly than do blue LEDs. In this context, "saturation" refers to the observed point at which an increase in current no longer increases the LED's output (whether expressed as an external quantum efficiency or radiant flux). As a result of this, lower current density has a larger positive effect on green LEDs. Specifically, at any given current (e.g., the normal 20 milliamps used to specify LEDs) the current density will be a function of the size of the chip. Thus, a larger area LED exhibits a proportionally smaller current density at 20 milliamps (or any other given current). This means that the saturation point for the larger-size green LEDs according to the invention will increase as compared to the green LEDs described in the '965 application. This is illustrated in FIG. 5.

FIG. 4 plots optical power efficiency (as used herein, milliwatts of light output per milliwatts of electrical power applied) for diodes according to the '965 application (shown as squares) and according to the present invention (shown as diamonds). These are again plotted against the dominant wavelength in nanometers. As illustrated in FIG. 4, the absolute increase in optical power efficiency is from 40 percent for the '965 diodes to 50-54 percent for the diodes according to the invention. This 10 percent absolute increase represents a 20 percent relative increase as between the two diodes.

The efficiency for the green wavelengths is even more striking. As illustrated in FIG. 4, the absolute increase in efficiency is again on the order of about 10 percent, but given the lower optical power efficiency (less than 20 percent) at the green wavelengths, this absolute increase of 10 percent represents a relative increase of 55 percent as between the diodes according to the present invention and those disclosed in the '965 application.

FIG. 5 is a plot of brightness enhancement (arbitrary units) as against chip size for diodes, including those according to the present invention. Although the '965 application is not limited to diodes with chip sizes of 300 microns per side, the 300 micron side size is an appropriate breaking point for comparison as between diodes from the '965 application and diodes according to the present invention. In addition to a showing the enhancement based on chip size, the diodes emitting in the blue frequencies (about 460 nanometers) are plotted using the diamond shapes and the dashed lines, and those emitting in the green frequencies (about 530 nanometers) are plotted using the open squares and the solid line.

FIG. 5 is also normalized using the output of a 300 by 300 nanometer chip according to the '965 application. Accordingly, FIG. 5 clearly demonstrates that both the blue and green emitting LEDs according to the invention offer strikingly enhanced output as compared to diodes from the '965 application. The more linear nature of the results for the green-emitting diodes reflects lower absorption of green in the crystal and the advantage of lower current density with a larger area. In comparison, the performance of the blue LEDs tends to level out or tail over based upon a higher absorption and lesser advantage based on the lower current density.

FIG. 5 also illustrates that diodes according to the present invention have their greatest increase in brightness enhancement at areas between about 100,000 and 200,000 square microns.

Figure 6:
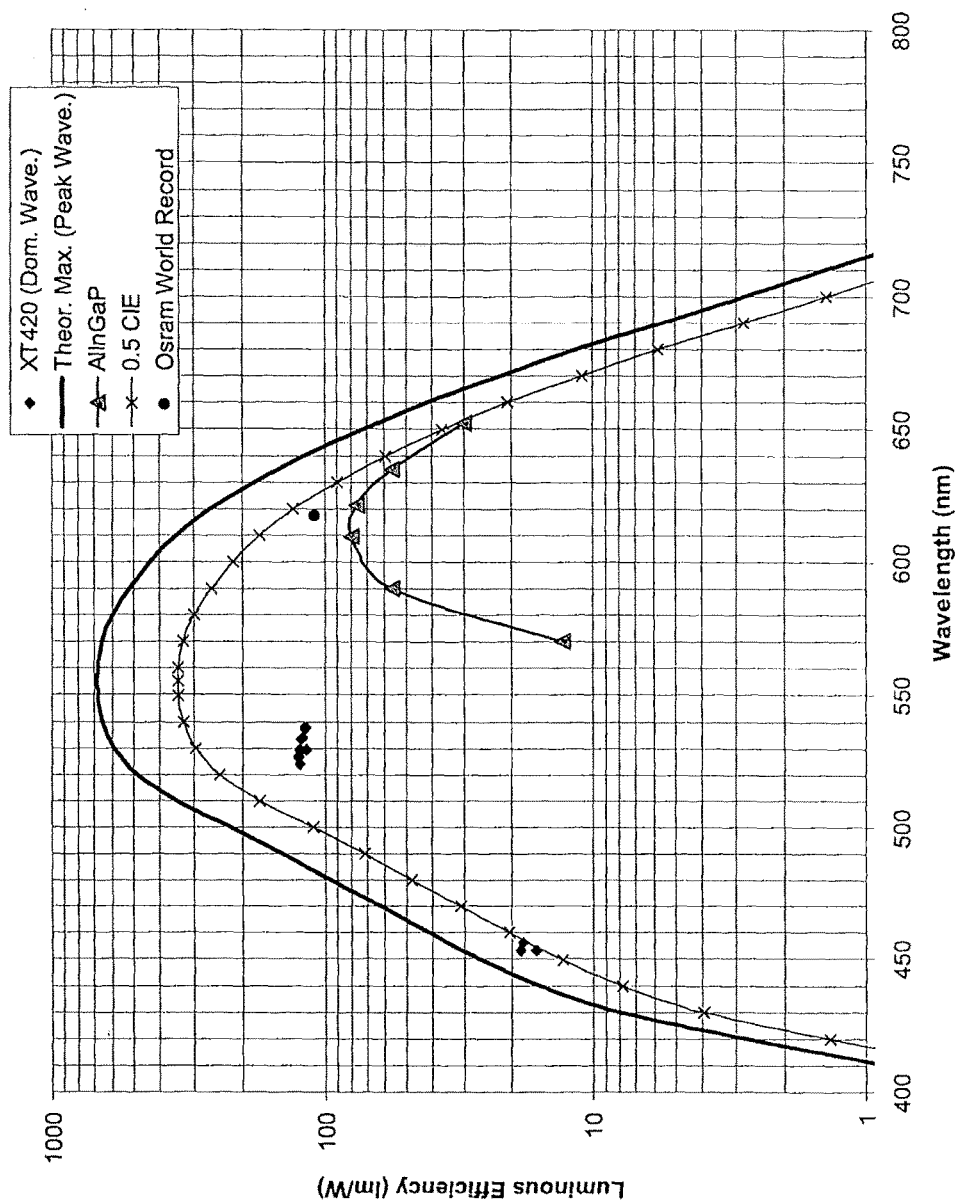
FIG. 6 is a plot of luminous efficiency versus wavelength for various diodes including those according to the present invention, and in comparison to theoretical maxima.

FIG. 6 is a plot of luminous efficiency (lumens per watt) for diodes according to the present invention and in comparison to other diodes and to theoretical maxima.

As noted elsewhere herein, the output and performance of a light emitting diode can be characterized using several related, but not identical, parameters. Luminous efficiency as plotted in FIG. 6 is equal to the energy conversion efficiency of the light emitting diode in converting electrical power into luminous flux. For an LED power (in watts) is the product of the forward current and the forward voltage. Luminous efficiency is accordingly expressed as lumens per watt.

The human eye is sensitive to light having wavelengths of between about 410 and 720 nm (the "visible" spectrum). Furthermore, within the visible spectrum, the eye responds differently to different wavelengths. As a result, the luminous flux is related to—and differs from—the radiant flux by a factor equivalent to the sensitivity of the human eye.

Thus, the solid bold line in FIG. 6 illustrates the theoretical maximum luminous efficiency observable by the human eye. At any given wavelength, the theoretical maximum is the "highest" point on the plot of FIG. 6.

For comparison purposes, a luminous efficiency equivalent to half of the theoretical maximum is plotted as the series of X's that form a corresponding curve below the theoretical maximum curve.

As an additional point of comparison, FIG. 6 plots the luminous efficiency curve for an aluminum indium gallium phosphide (AlInGaP) light emitting diode as the series of triangles with emissions between about 570 and 650 nm.

As yet another point of comparison, a "world record" (with respect to efficiency regardless of wavelength) light emitting diode from Osram is shown as the circle at approximately 620 nm and slightly above 100 lumens per watt.

Diodes according to the invention are plotted as the diamond shapes in FIG. 6. They demonstrate a luminous efficiency of between 15 and 20 lumens per watt at a dominant wavelength of between 450 and 460 nm and, even more impressively, demonstrate a luminous efficiency greater than 100 lumens per watt at wavelengths between 520 and 540 nanometers.

Accordingly, in another aspect the invention is a blue light emitting diode with a luminous efficiency above 15 lumens per watt at a dominant wavelength between 450 and 460 nm.

In a similar aspect, the invention is a green light emitting diode with a luminous efficiency greater than 100 lumens per watt at a dominant wavelength between 520 and 540 nanometers.

As used in the art (and herein), the term "dominant wavelength" describes a measure of the hue sensation produced in the human eye by a light emitting diode. The dominant wavelength is determined by drawing a straight line through the color coordinates of a reference illuminant and the measured chromaticity coordinates of the LED in the International Commission on Illumination (CIE) 1931 chromaticity diagram. The intersection of the straight-line on the boundary of the chromaticity diagram gives the dominant wavelength.

The peak wavelength is the wavelength at the maximum spectral power. The peak wavelength may have less significance for practical purposes because two different light emitting diodes may have the same peak wavelength, but different color perception.

Radiant flux, which is also referred to as the radiant power, is the rate (dθ/dt) at which the radiation field transfers radiant energy from one region to another. As noted above, if theta (θ) is the radiant energy, the unit of radiant power is the watt.

An appropriate discussion of these and other optical characteristics of light emitting diodes is set forth in the Labsphere Technical Guide, "The Radiometry of Light Emitting Diodes," from Labsphere Inc. of North Sutton N.H.

As known to those familiar with light emitting diodes and their packages, of the photons generated by current injected through the diode, less than 100% escape externally from the diode. Accordingly, in this art, the term "external quantum efficiency" is used to describe the ratio of emitted light intensity to current flow (e.g., photons out/electrons in). Photons can be lost through absorption within the semiconductor material itself, through reflection losses when light passes from the semiconductor to air because of the differences in refractive index, and from the total internal refraction of light at angles greater than the critical angle defined by Snell's law. Accordingly, the external quantum efficiency (EQE) as a percentage can be calculated from the radiant flux (Watts), the wavelength (nanometers), the drive current (amps) and the conversion factor between wavelength and energy (λ=1.24/eV) according to the following formula:

$$EQE(\%) = \frac{(\text{radiant flux}) \times (\text{wavelength})}{(1240) \times (\text{drive current})} \times 100$$

As used herein, and for purposes of describing and defining the luminous output, the light emitting area or surface is defined as the "footprint" of the device. For a chip or die with different portions having different dimensions, the term "area" means the largest area of semiconductor or substrate material within the die or chip, because this largest dimension is the one that the circuit or device designer must deal with in using the individual light emitting diode.

Expressed in alternative fashion, but with the same meaning, the area is the larger of either (i) the largest semiconductor area in the diode or (ii) the substrate area of the diode that must or will be packaged. In almost all circumstances, area (ii) is greater or equal to area (i).

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
   a light emitting layer that comprises a Group III nitride material system;
   a first ohmic contact on said light emitting layer;
   a silver-based layer between said first ohmic contact and said light emitting layer, said silver-based layer including a first face of said silver-based layer adjacent said first ohmic contact, a second face of said silver-based layer adjacent and directly contacting said light emitting layer and a sidewall of said silver-based layer that extends between said first and second faces;
   a barrier layer between said first ohmic contact layer and said silver-based layer and directly contacting said first ohmic contact layer, said barrier layer extending on said first face of said silver-based layer and further extending on said sidewall of said silver-based layer to directly contact said light emitting layer;
   a transparent conductive substrate on said light emitting layer opposite said silver-based layer; and
   a second ohmic contact directly on said transparent conductive substrate opposite said light emitting layer.

2. A light emitting diode according to claim 1 wherein said transparent conductive substrate comprises a silicon carbide single crystal substrate.

3. A light emitting diode according to claim 2 further comprising a buffer layer between said silicon carbide substrate and said light emitting layer, said buffer layer comprising the Group III nitride material system.

4. A light emitting diode according to claim 3 further comprising at least two layers of opposite conductivity type comprising the Group III nitride material system for providing carriers for recombination and light emission under an applied current.

5. A light emitting diode according to claim 4 wherein said light emitting layer includes at least one layer of indium gallium nitride.

6. A light emitting diode according to claim 2 wherein said silicon carbide substrate is n-type and has a polytype selected from the 3C, 4H, 6H, and 15R polytypes of silicon carbide.

7. A light emitting diode according to claim 1 wherein said light emitting layer comprises a doped semiconductor layer, said silver-based layer is directly on said doped semiconductor layer and said barrier layer is directly on said first face of said silver-based layer and completely encloses said sidewall of said silver-based layer.

8. A light emitting diode according to claim 7 wherein said doped semiconductor layer is a p-type semiconductor layer.

9. A light emitting diode according to claim 1 wherein said transparent conductive substrate includes an oblique sidewall.

10. A light emitting diode according to claim 9;
wherein said second ohmic contact is directly on a face of said transparent conductive substrate that is opposite said light emitting layer, and
wherein said second ohmic contact extends on only a first portion of said face and exposes a second portion of said face.

\* \* \* \* \*

UNITED STATES PATENT AND TRADEMARK OFFICE
CERTIFICATE OF CORRECTION

PATENT NO. : 9,905,731 B2
APPLICATION NO. : 12/796365
DATED : February 27, 2018
INVENTOR(S) : Edmond et al.

Page 1 of 1

It is certified that error appears in the above-identified patent and that said Letters Patent is hereby corrected as shown below:

On the Title Page

Item (56) References Cited, Foreign Patent Documents:
Please add the following citations:
JP 10-114600A
JP 2004-511080A Signed and Sealed this
Third Day of July, 2018

Andrei Iancu
*Director of the United States Patent and Trademark Office*